United States Patent

Wyborn et al.

[11] Patent Number: 5,874,360
[45] Date of Patent: Feb. 23, 1999

[54] MANUFACTURE OF SEMICONDUCTOR DEVICES

[75] Inventors: Graeme Michael Wyborn, Surrey; Christopher McGee; Howard Charles Nicholls, both of Wales, all of United Kingdom

[73] Assignee: SGS-Thomson Microelectronics Limited, United Kingdom

[21] Appl. No.: 427,458

[22] Filed: Apr. 24, 1995

Related U.S. Application Data

[63] Continuation of Ser. No. 119,417, Sep. 10, 1993, abandoned.

[30] Foreign Application Priority Data

Sep. 11, 1992 [GB] United Kingdom .................. 9219281

[51] Int. Cl.$^6$ .................................................. H01L 21/441
[52] U.S. Cl. ...................... 438/680; 438/685; 438/656; 438/648
[58] Field of Search ..................................... 437/187, 192, 437/245, 926; 438/680, 685, 656, 648, 675, 672

[56] References Cited

U.S. PATENT DOCUMENTS

| 4,404,235 | 9/1983 | Tarng et al. .............................. 427/89 |
| 4,405,235 | 9/1983 | Tarng et al. . |

(List continued on next page.)

FOREIGN PATENT DOCUMENTS

| 0 147 203 | 7/1985 | European Pat. Off. . |
| 0 256 917 A1 | 2/1988 | European Pat. Off. . |
| 0 305 143 A2 | 3/1988 | European Pat. Off. . |
| 0 285 410 | 10/1988 | European Pat. Off. . |
| 0 310 108 | 4/1989 | European Pat. Off. . |
| 0 373 344 A3 | 6/1990 | European Pat. Off. ........ H01L 21/90 |
| 0 414 267 A3 | 2/1991 | European Pat. Off. ...... H01L 21/285 |
| 5-152292 | 6/1993 | Japan . |
| 1564762 | 4/1980 | United Kingdom . |
| 2 239 661 | 7/1991 | United Kingdom . |
| 2239661 | 7/1991 | United Kingdom . |

OTHER PUBLICATIONS

"Surface Chemistry of the $WF_6$–based chemical vapor deposition of tungsten," IBM J Res Develop, vol. 34 No. 6, Nov. 1990, pp. 875–883.

"Chemical Vapor Deposition Tungsten via Plug Process With Development Polyimide Interlevel Dielectric in a Multilevel System," Journal of Vac. Sci. Technol. B 10 (5), Sep./Oct., 1992, pp. 2277–2282.

(List continued on next page.)

*Primary Examiner*—Caridad Everhart
*Attorney, Agent, or Firm*—Felsman, Bradley, Gunter & Dillon, LLP

[57] ABSTRACT

A method of fabricating a tungsten contact in a semiconductor device, the method including the steps of: (a) providing a silicon wafer structure including a dielectric layer and an underlying layer selected from a semiconductor or electrically conductive material, the dielectric layer being patterned to expose a contact portion of the underlying layer; and (b) depositing by chemical vapor deposition a tungsten layer over the dielectric layer and the contact portion, the deposition being carried out by reaction of a tungsten-containing component and a reducing agent which are introduced into the vicinity of the silicon wafer structure, the deposition step having a first phase in which the process conditions are controlled to form a seed layer of tungsten on the dielectric layer and a second phase in which the process conditions are modified from the first phase to form a blanket tungsten layer over the seed layer which acts as an adhesion layer between the dielectric layer and the blanket tungsten layer. The invention also provides a semiconductor device incorporating a tungsten contact which is disposed in a contact hole of a dielectric layer, the tungsten contact including a seed layer of tungsten which extends over the dielectric layer surface and an overlying layer of blanket tungsten.

29 Claims, 1 Drawing Sheet

U.S. PATENT DOCUMENTS

| | | | |
|---|---|---|---|
| 4,617,087 | 10/1986 | Iyer et al. ................................ | 156/643 |
| 4,710,398 | 12/1987 | Homma et al. . | |
| 4,777,061 | 10/1988 | Wu et al. ................................ | 437/187 |
| 4,804,560 | 2/1989 | Shioya et al. .......................... | 427/125 |
| 4,902,645 | 2/1990 | Ohba ...................................... | 437/200 |
| 4,917,759 | 4/1990 | Fisher et al. . | |
| 5,227,336 | 7/1993 | Hirano et al. .......................... | 437/192 |
| 5,270,254 | 12/1993 | Chen et al. . | |
| 5,332,693 | 7/1994 | Kim . | |
| 5,407,698 | 4/1995 | Emesh ..................................... | 427/99 |
| 5,429,991 | 7/1995 | Iwasaki et al. . | |
| 5,795,824 | 8/1998 | Hancock . | |

OTHER PUBLICATIONS

Chemical Vapor Deposition Tungsten via Plug Process Development with Polyimide interlevel dielectric in a multilevel metal system, *Journal of Vacuum Science & Technology*, vol. 10, No. 5, Sep. 1992.

Radio Corporation of America.

Adhesion of LPCVD Wsix/W Bilayers On Oxide Films, 1992, pp 305–311; Ph. LAMI; Ph. Normandon; J.C. Oberlin; Materials Research Society, Conference Proceedings ULSI–VII.

Wolf, Silicon Processing for the VLSI Era, vol. 2 "rocess Integration", pp. 244–252.

MANUFACTURE OF SEMICONDUCTOR DEVICES

This is a continuation, of application Ser. No. 08/119,417, filed Sep. 10, 1993 abandoned.

BACKGROUND TO THE INVENTION

The present invention relates to a method of fabricating a tungsten contact in the form of a plug or via in a semiconductor device incorporating a tungsten contact and in particular relates to such a method employing deposition and etch back of a layer of CVD tungsten.

In semiconductor processing technology it is well known that the step coverage obtained with conventional metallisation processes for the fabrication of contacts in the form of plugs and vias using metals such as aluminium can become a problem as the dimensions of the contacts are reduced to below about 1.5 microns. The reduced step coverage tends to increase the specific contact resistivity of the contacts and the reliability of the contacts is also reduced. Poor step coverage also tends to prevent vertical stacking of the contacts over contacts in the previous interconnect layer. Metal step coverage can be increased by reducing the thickness of the dielectric layer in which the contact is formed. However, this can consequently increase the capacitance and inductance of the layer which tends to produce a reduction in the speed of the resultant semiconductor device.

It is known, in an attempt to overcome this step coverage problem with conventional metallisation, to employ tungsten plug technology in which a contact hole is filled with tungsten by a chemical vapour deposition process to form a contact in the form of a plug or via. The two general tungsten deposition processes employed are blanket tungsten deposition followed by an etch back so as to leave tungsten contacts in the dielectric layer or to employ selective deposition in which tungsten is selectively deposited in contact holes formed in the dielectric layer. Selective tungsten deposition suffers from technical problems which are, for example, the difficulty in filling contact hole of differing depths, the relatively high specific contact resistance of the contacts and a breakdown in the selectivity of the deposition process. The semiconductor industry is increasingly aiming at employing blanket tungsten deposition followed by etch back in order to form tungsten contacts, in the form of plugs and vias which does not suffer from the above stated problems associated with selective tungsten deposition.

It is generally known in the industry that blanket CVD tungsten does not adhere well to dielectric films. Accordingly, it is the general practice to employ an adhesion layer between the dielectric layer and the deposited tungsten, the adhesion layer additionally having been formed over the exposed portions of the silicon substrate to which the tungsten is to be electrically connected. Typically, the adhesion layer comprises a thin, highly adherent sputtered metal film, for example titanium nitride. The adhesion layer is deposited before the silicon wafer is transferred into a CVD tungsten deposition system. The CVD tungsten blanket layer then adheres adequately to the adhesion layer. The adhesion layer is selected so as to be thin enough so as not to reduce the size of the contact but thick enough so as to give sufficient adhesion between the dielectric layer and the overlying tungsten layer. Typically, the adhesion layer is 500 to 1000 Angstroms thick.

It has been found that when an adhesion layer is employed there can be inadequate coverage of the adhesion layer on the side walls of the contact. In addition, when the adhesion layer is applied by sputtering, problems with step coverage in the contact hole can also occur. In addition, when it is desired to reduce the dimensions of the contacts, this can lead to a limitation in the reduction in dimensions as a result of problems with step coverage when employing a sputtering process. When the adhesion layer is deposited by a process other than by sputtering, it may be that the adhesion layer itself is not particularly well adhered to the dielectric layer. In the light of these problems, there is a general need in the industry by both semiconductor equipment vendors and semiconductor manufacturers to eliminate the need for the additional adhesion layer when employing blanket CVD tungsten deposition. This would greatly simplify manufacture of the semiconductor devices by eliminating problems associated with the deposition of the adhesion layer. Furthermore, there is a general need to reduce device dimensions which are currently restricted by the scaling limitations of the technology employed to sputter the adhesion layer.

In a paper entitled "Adhesion of LPVCD WSix/W Bilayers on Oxide Films" by Lami et al, published in the conference proceedings entitled "Advanced Metallization for ULSI Applications" of a conference held by the Materials Research Society on 8–10 Oct. 1991, it is disclosed that WSix LPCVD underlayers were used as adhesion layers on oxides for CVD W metallisation. However, such WSix adhesion layers suffered from a number of problems showing that the obtaining of a manufacturable bilayer of WSix/W is not straightforward because of a sensitivity to the temperature gradient that always occurs during silicide deposition from silane or DCS.

SUMMARY OF INVENTION

The present invention aims at least partially to overcome these problems in the prior art.

Accordingly, the present invention provides a method of fabricating a tungsten contact in a semiconductor device, the method including the steps of: (a) providing a silicon wafer structure including a dielectric layer and an underlying layer selected from a semiconductor or electrically conductive material, the dielectric layer being patterned to expose a contact portion of the underlying layer; and (b) depositing by chemical vapour deposition a tungsten layer over the dielectric layer and the contact portion, the deposition being carried out by reaction of a tungsten-containing component and a reducing agent which are introduced into the vicinity of the silicon wafer structure, the deposition step having a first phase in which the process conditions are controlled to form a seed layer of tungsten on the dielectric layer and a second phase in which the process conditions are modified from the first phase to form a blanket tungsten layer over the seed layer which acts as an adhesion layer between the dielectric layer and the blanket tungsten layer.

The present invention also provides a semiconductor device incorporating a tungsten contact which is disposed in a contact hole of a dielectric layer, the tungsten contact including a seed layer of tungsten which extends over the dielectric layer surface and an overlying layer of blanket tungsten.

BRIEF DESCRIPTION OF THE DRAWINGS

Embodiments of the present invention will now be described by way of example only, with reference to the accompanying drawings, in which.

DETAILED DESCRIPTION OF THE PREFERRED EMBODIMENTS

Figure 1:
FIG. 1 is a schematic section through a silicon wafer structure prior to the deposition of a dielectric layer in accordance with an embodiment of the present invention.
Figure 2:
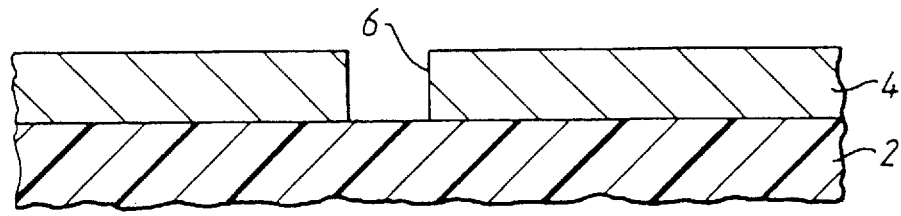
FIG. 2 is a schematic section through the silicon wafer structure of FIG. 1 after the dielectric layer has been deposited over the structure.

Referring to FIGS. 1 to 4, there is shown a process flow for the manufacture of a tungsten contact in the form of a plug or via in a dielectric layer in accordance with an embodiment of the present invention. As shown in FIG. 1, there is initially provided a substrate 2 of silicon which may be provided in known manner with doped and undoped regions. A dielectric layer 4 is deposited over the silicon substrate 2 in a known manner with the dielectric layer 4 being patterned to provide a contact hole 6 therein and the resultant structure is illustrated in FIG. 2. The dielectric layer 4 is typically composed of silicon dioxide and the contact hole 6 may be located over an implant which is formed before or after the formation of the dielectric layer in known manner. Typically, the dielectric layer has a thickness of from 4000 to 12000 Angstroms. FIG. 2 shows the starting structure for the method of the invention in which a tungsten contact is formed in the contact hole 6. Prior to the deposition of the tungsten in accordance with the illustrated embodiment of the present invention, which will be described with reference to FIG. 3, no particular pretreatment steps are carried out on the silicon substrate 2 or the dielectric layer 4.

Figure 3:
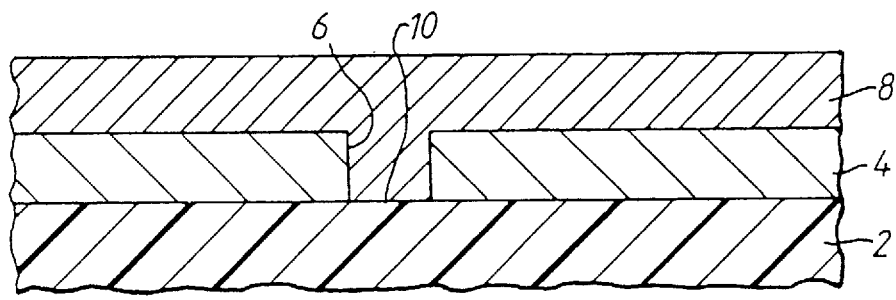
FIG. 3 is a schematic section through the silicon wafer structure of FIG. 2 after a tungsten layer has been deposited over the structure in a two step deposition process.

Referring to FIG. 3, tungsten is deposited by a two-step chemical vapour deposition process over the dielectric layer 4 and silicon substrate 2 to form a tungsten layer 8 which extends both over the dielectric layer 4 and downwardly into the contact hole 6 so as completely to fill the contact hole 6.

Both of the steps are carried out in a common CVD tungsten deposition apparatus of known construction. The two steps are differentiated by the particular process conditions in the respective steps and in particular by variation of the gas pressures of various constituents introduced into the CVD tungsten deposition apparatus during the respective steps. In the first step, tungsten is deposited on any exposed silicon since the tungsten-containing compound is reduced by the silicon but not on the surface of the dielectric layer. In the second step, there are two deposition phases for the deposition of tungsten on the dielectric layer. In the first phase a tungsten seed layer is formed over the dielectric layer and in the second phase a blanket CVD tungsten layer is deposited over the seed layer. In the second step also, tungsten is deposited onto the tungsten deposited in the first step.

In the first step, the silicon wafer having, for example, the contact hole 6 structure shown in FIG. 2 when a tungsten contact in the form of a plug or via is to be formed in the contact hole 6, is introduced into the CVD tungsten deposition apparatus. The wafer is heated to a temperature of from 200° to 300° C. and suitable tungsten-containing gas, generally tungsten hexafluoride $WF_6$ gas, is introduced into the deposition chamber. The $WF_6$ is preferably introduced having a dynamic partial pressure of from 1 to 2 mTorr and the flow rate is typically from 5 to 14 sccm (standard cm$^3$/min). The $WF_6$ is introduced in this manner for a process period of typically from 1 to 60 seconds, more preferably from 10 to 60 seconds.

In the second step of the tungsten deposition process, the wafer temperature and the $WF_6$ flow are maintained within the ranges specified above in relation to the first step. Additionally, hydrogen $H_2$ gas can be introduced into the deposition chamber if required, preferably at a dynamic partial pressure of from 0 to 100 mTorr and typically at a flow rate of from 0 to 1000 sccm. In addition, in the second step a suitable reducing agent, generally silane $SiH_4$ gas, is introduced into the deposition chamber, silane conventionally being employed to reduce the $WF_6$ in order to deposit tungsten metal. The silane is introduced under carefully controlled dynamic partial pressures and flow conditions so as to provide an initial burst of silane flow which is then reduced to an equilibrium level. A typical silane process flow is illustrated in FIG. 5 which shows the relationship between the silane partial pressure with time in the second step of the deposition process.

Figure 5:
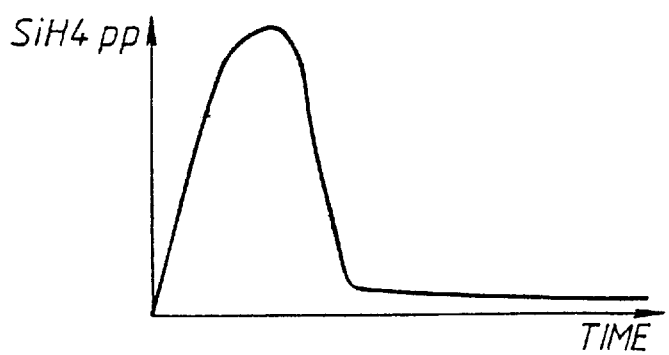
FIG. 5 is a graph showing the relationship between the transient dynamic partial pressure of silicon hydride with time during a second step of the tungsten deposition process.

As will be seen from FIG. 5, the silane partial pressure (pp) is rapidly increased from zero to a peak value after which the partial pressure of the silane is rapidly decreased to an equilibrium value. The peak value of the silane dynamic partial pressure is typically from 10 to 100 mTorr and the equilibrium dynamic partial pressure of the silane is typically from 1 to 2 mTorr. At the silane peak, the silane/WF partial pressure ratio is high, and preferably ranges from 10:1 to 100:1. In the equilibrium region, the partial pressure of the silane is preferably less than that of the $WF_6$, and typically the silane/$WF_6$ partial pressure ratio is around 0.5 to 0.7. The silane flow rate is typically sustained at a value of from 5 to 15 sccm. Typically, the silane peak shown in FIG. 5 representing the initial burst of silane pressure occurs within about 1 second in the second step of the deposition process. The width of the silane peak at half height is typically about half a second. The gas partial pressures of the tungsten hexafluoride and the hydrogen in the second deposition step are controllably damped, in other words they are controlled so as smoothly to increase up to a selected maximum value which is maintained as the equilibrium value. These values are selected so as to provide high rate tungsten deposition conditions in the second step of the deposition process. After a desired period for the second step of the deposition process, which is selected based on the desired thickness of the tungsten CVD layer, the tungsten hexafluoride, hydrogen and silane gas flows are terminated. The resultant silicon wafer structure is illustrated in FIG. 3 which shows a CVD tungsten layer 8 deposited over the dielectric layer 4 and the exposed contact portion 10 of the silicon substrate 2 which is located at the bottom of the contact hole 6. Thus the CVD tungsten layer 8 completely fills the contact hole 6 and also extends over the dielectric layer 4. Preferably, the tungsten layer 8 has a thickness, over the dielectric layer 4 equivalent to a thickness of from ½ to 1½ times the contact diameter. The contact diameter is generally from 0.4 to 1.5 microns, typically from 0.5 to 1.0 microns.

Figure 4:
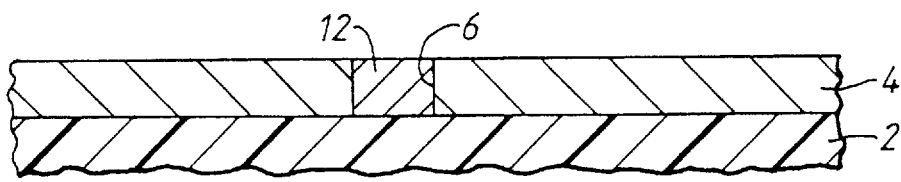
FIG. 4 is a schematic section through the silicon wafer structure of FIG. 3 after etch back of the tungsten layer.

The structure illustrated in FIG. 3 is then subjected to a conventional tungsten etch back process in which the tungsten layer 8 is etched down to the dielectric layer 4 so as to leave the structure shown in FIG. 4 in which a tungsten contact 12 is located in the contact hole 6 in the dielectric layer 4 and in contact with the silicon substrate 2. A conventional interconnect layer e.g. of aluminium may then be formed over the tungsten contact 12.

In the tungsten deposition method of the present invention, the nucleation and deposition conditions for the tungsten are carefully controlled. The conditions of the first and second steps of the deposition process create on the surface of the dielectric layer 4 and on the exposed surface of the silicon substrate 2 a seed layer of blanket CVD tungsten which is highly smooth and reflective and conforms to the initial surface of the wafer structure. This seed layer has high step coverage, low stress and low resistivity. Typically, the resistance of the resultant tungsten contact is around 720 milliohms and the seed layer has a thickness of up to 1500 Angstroms. It is believed that the preferred seed layer thickness lies within the range from 100 to 1000 Angstroms, although such a thickness is believed to be difficult to determine by measurement. The seed layer of the blanket CVD tungsten has a small grain size and is highly adherent to the dielectric layer.

The seed layer of blanket CVD tungsten is initially formed during the burst of silane partial pressure at the beginning of the second step of the deposition process. Without being bound by theory, it is believed that in the initial step of the deposition process, in which tungsten hexafluoride is introduced over the hot wafer, the tungsten hexafluoride gas molecules are physically adsorbed onto the surface of the dielectric layer. Since there is no reducing agent present in the vicinity of the dielectric layer, because silane has not yet been introduced into the atmosphere, tungsten is not deposited onto the surface of the dielectric layer but rather the surface of the dielectric layer is preconditioned by the physical absorbtion thereonto of the tungsten hexafluoride molecules. On the exposed silicon surface at the bottom of the contact hole, the tungsten hexafluoride is reduced by the silicon to create a thin tungsten layer which only is located at the bottom of the contact hole 6. In the second step of the deposition process, the initial burst of silane causes a tungsten layer rapidly to be formed over the dielectric layer so as to form the initial seed layer of blanket CVD tungsten which acts subsequently as an adhesion layer between the dielectric layer and the subsequently deposited CVD tungsten which is deposited in the equilibrium phase of the second step of the deposition process. It is believed that since the tungsten hexafluoride molecules have been physically adsorbed onto the surface of the dielectric layer, a rapid burst of silane causes nucleation conditions to be created which enable uniform nucleation of the seed layer of blanket CVD tungsten over the surface of the dielectric layer. This, for reasons which are not fully understood, has been found by the present inventors to form an initial seed layer of tungsten which, in contrast to the prior art, adheres strongly and uniformly to the dielectric layer. It is believed by the inventors that the seed layer is composed substantially of tungsten, although it may contain some incidental impurities, and in this specification the term "seed layer of tungsten" should be construed accordingly. After this seed layer has been formed, conventional blanket CVD tungsten is deposited at a high rate on top of the seed layer to form the final tungsten layer 8 shown in FIG. 3.

In the tungsten deposition process, the temperature of the wafer is lower than that which is typically employed in conventional tungsten CVD deposition processes and in addition, the tungsten hexafluoride and, particularly, the silane partial pressures are lower than in conventional tungsten CVD deposition processes. The hydrogen gas is employed in the tungsten deposition step to enable the temperature over the wafer to be maintained substantially uniform. In addition, the hydrogen gas acts to dilute the silane and tungsten hexafluoride gases thereby to slow down the long term steady state reactions. The hydrogen gas acts as a moderator or buffer in the tungsten deposition process.

We have found that the tungsten deposition process of the present invention overcomes the problems in the prior art concerning high resistivity tungsten contacts. This is because the seed layer of blanket CVD tungsten which is initially formed in the contact hole 6 has good electrical contact with the silicon substrate so that the resultant contact has a low resistivity. In addition, the dimensions of the tungsten contacts formed in accordance with the present invention can be reduced relative to the prior art. In known processes in which an adhesion layer is sputtered over the dielectric layer into the contact hole, this can provide inherent step coverage limitations. In accordance with the preferred embodiments of the present invention, the two step CVD tungsten deposition process can enable uniform thickness of tungsten contacts to be obtained even with small contact holes because no sputtered adhesion layer is required. Typically, with sputtered adhesion layers, the contact size can be as low as 0.7 microns whereas with the two step CVD tungsten deposition process of the invention the contact size can be reduced to as low as 0.4 microns, or even lower if this is permitted with the desired contact resistance parameters.

In its broadest aspects the present invention encompasses the fabrication of a tungsten contact on an underlying layer which may be a semiconductor material such as silicon or an electrically conductive material such as an interconnect layer. The interconnect layer may be a layer of material which acts as a capping layer to an underlying interconnect layer of aluminium, the capping layer acting to permit tungsten deposition thereon. The capping layer may typically comprise a layer of tungsten, titanium or titanium nitride.

What we claim is:

1. A method of fabricating a tungsten contact in a semiconductor device, the method including the steps of:

(a) providing a silicon wafer structure including a dielectric layer and an underlying layer selected from a semiconductor or electrically conductive material, the dielectric layer being patterned to expose a contact portion of the underlying layer; and (b) depositing by chemical vapour deposition a tungsten layer over the dielectric layer and the contact portion, the deposition being carried out by reaction of a tungsten-containing component and a reducing agent which are introduced into the vicinity of the silicon wafer structure, the deposition step having a first phase in which the process conditions are controlled to form a seed layer of tungsten on the dielectric layer and a second phase in which the process conditions are modified from the first phase to form a blanket tungsten layer over the seed layer which acts as an adhesion layer between the dielectric layer and the blanket tungsten layer, wherein the partial pressure of the reducing agent in the first phase is higher than the partial pressure of the reducing agent in the second phase.

2. A method of fabricating a tungsten contact in a semiconductor device, the method including the steps of:

(a) providing a silicon wafer structure including a dielectric layer and an underlying layer selected from a semiconductor or electrically conductive material, the dielectric layer being patterned to expose a contact portion of the underlying layer; and (b) depositing by chemical vapor deposition a tungsten layer over the dielectric layer and the contact portion, the deposition being carried out by reaction of a tungsten-containing component and a reducing agent which are introduced into the vicinity of the silicon wafer structure, the deposition step having a first phase in which the process conditions are controlled to form a seed layer of tungsten on the dielectric layer and a second phase in which the process conditions are modified from the first phase to form a blanket tungsten layer over the seed layer which acts as an adhesion layer between the dielectric layer and the blanket tungsten layer, wherein before the depositing step (b) the tungsten-containing component is introduced, substantially in the absence of the reducing agent, in the vicinity of the silicon wafer structure.

3. A method according to claim 1 wherein the tungsten-containing component comprises tungsten hexafluoride.

4. A method according to claim 1 wherein the reducing agent comprises silane.

5. A method according to claim 1 in which in the first phase of the deposition step, the reducing agent partial pressure is increased to a value of from 10 to 100 mTorr.

6. A method according to claim 5 wherein in the second phase of the deposition step the partial pressure of the reducing agent is reduced to an equilibrium partial pressure of from 1 to 2 mTorr.

7. A method according to claim 1 wherein in the deposition step the partial pressure of the tungsten-containing component is from 1 to 2 mTorr.

8. A method according to claim 1 wherein in the deposition step the wafer temperature is from 200° to 300° C.

9. A method of fabricating a tungsten contact in a semiconductor device, the method including the steps of:
   (a) providing a silicon wafer structure including a dielectric layer and an underlying layer, the dielectric layer being patterned to expose a contact portion of the underlying layer;
   (b) introducing a tungsten-containing component, substantially in the absence of a reducing agent, in the vicinity of the silicon wafer structure; and
   (c) depositing by chemical vapor deposition a tungsten layer over the dielectric layer and the contact portion, the deposition being carried out by reaction of the tungsten-containing component and a reducing agent which are introduced into the vicinity of the silicon wafer structure, the deposition step having a first phase in which a seed layer of tungsten is formed on the dielectric layer and a second phase in which a blanket tungsten layer is formed over the seed layer which acts as an adhesion layer between the dielectric layer and the blanket tungsten layer, the partial pressure of the reducing agent in said first phase is higher than in the second phase.

10. A method according to claim 9 wherein the tungsten-containing component comprises tungsten hexafluoride.

11. A method according to claim 9 wherein the reducing agent comprises silane.

12. A method according to claim 9 in which in the first phase of the deposition step, the reducing agent partial pressure is increased to a value of from 10 to 100 mTorr.

13. A method according to claim 12 wherein in the second phase of the deposition step the partial pressure of the reducing agent is reduced to an equilibrium partial pressure of from 1 to 2 mTorr.

14. A method according to claim 9 wherein in the deposition step the partial pressure of the tungsten-containing component is from 1 to 2 mTorr.

15. A method according to claim 9 wherein in the deposition step the wafer temperature is from 200° to 300° C.

16. A method according to claim 9 wherein the underlying layer is a semiconductor.

17. A method according to claim 9 wherein the underlying layer is an electrically conductive material.

18. A method of fabricating a tungsten contact in a semiconductor device, the method including the steps of:
   (a) providing a silicon wafer structure including a dielectric layer and an underlying layer, the dielectric layer being patterned to expose a contact portion of the underlying layer;
   (b) introducing a tungsten-containing component, substantially in the absence of a reducing agent, in the vicinity of the silicon wafer structure; and
   (c) depositing by chemical vapor deposition a tungsten layer over the dielectric layer and the contact portion, the deposition being carried out by reaction of the tungsten-containing component and a reducing agent, the deposition step having a first phase in which a seed layer of tungsten is formed on the dielectric layer and a second phase in which a blanket tungsten layer is formed over the seed layer which acts as an adhesion layer between the dielectric layer and the blanket tungsten layer, wherein a partial pressure of the reducing agent is increased within about 1 second during the second phase to a peak value, maintained at the peak value for about 0.5 seconds, and reduced to an equilibrium value.

19. A method of fabricating a tungsten contact in a semiconductor device, the method including the steps of:
   (a) providing a silicon wafer structure including a dielectric layer and an underlying layer selected from a semiconductor or electrically conductive material, the dielectric layer being pattered to expose a contact portion of the underlying layer; and
   (b) depositing by chemical vapor deposition a tungsten layer over the dielectric layer and the contact portion, the deposition being carried out by reaction of a tungsten-containing component and a reducing agent which are introduced into the vicinity of the silicon wafer structure, the deposition step having a first phase in which the process conditions are controlled to form a seed layer of tungsten on the dielectric layer and a second phase in which the process conditions are modified from the first phase to form a blanket tungsten layer over the seed layer which acts as an adhesion layer between the dielectric layer and the blanket tungsten layer, wherein the partial pressure of the reducing agent in the first phase is at least ten times higher than the partial pressure of the reducing agent in the second phase.

20. A method according to claim 19 wherein the partial pressure of the reducing agent is higher than the partial pressure of the reducing agent is higher than the partial pressure of the tungsten containing component in the first phase and lower than the partial pressure of the tungsten-containing component in the second phase.

21. A method according to claim 19 wherein the first phase the partial pressure of the reducing agent reaches a peak value about one second after the start of the depositing step (b).

22. A method according to claim 19 wherein before the depositing step (b) the tungsten-containing component is introduced, substantially in the absence of the reducing agent, in the vicinity of the silicon wafer structure.

23. A method according to claim 22 wherein the tungsten-containing component is introduced, substantially in the absence of the reducing agent, in the vicinity of the silicon wafer structure for a period of from 10 to 60 seconds.

24. A method according to claim 19 wherein the reducing agent comprises silane and the tungsten-containing component comprises tungsten hexafluoride.

25. A method of fabricating a tungsten contact in a semiconductor device, the method including the steps of:
  (a) providing a silicon wafer structure including a dielectric layer and an underlying layer, the dielectric layer being patterned to expose a contact portion of the underlying layer;
  (b) introducing a tungsten-containing component, substantially in the absence of a reducing agent, in the vicinity of the silicon wafer structure; and
  (c) depositing by chemical vapor deposition a tungsten layer over the dielectric layer and the contact portion, the deposition being carried out by reaction of the tungsten-containing component and a reducing agent which are introduced into the vicinity of the silicon wafer structure, the deposition step having a first phase in which a seed layer of tungsten is formed on the dielectric layer and a second phase in which a blanket tungsten layer is formed over the seed layer which acts as an adhesion layer between the dielectric layer and the blanket tungsten layer, the partial pressure of the reducing agent in said first phase being higher than in the second phase, and the partial pressure of the reducing agent being respectively higher and lower than the partial pressure of the tungsten-containing component in the first and second phases.

26. A method according to claim 25 wherein the partial pressure of the reducing agent in the first phase is at least ten times higher than the partial pressure of the reducing agent in the second phase.

27. A method according to claim 25 wherein in the first phase the partial pressure of the reducing agent reaches a peak value about one second after the start of the depositing step (c).

28. A method according to claim 25 wherein in introducing step (b) the tungsten-containing component is introduced for a period of from 10 to 60 seconds.

29. A method according to claim 25 wherein the reducing agent comprises silane and the tungsten-containing component comprises tungsten hexafluoride.

* * * * *